(12) United States Patent
Liao

(10) Patent No.: US 8,476,650 B2
(45) Date of Patent: Jul. 2, 2013

(54) FILM-COVERED LED DEVICE

(76) Inventor: Pei-Ling Liao, Taoyuan County (TW)

( * ) Notice: Subject to any disclaimer, the term of this patent is extended or adjusted under 35 U.S.C. 154(b) by 212 days.

(21) Appl. No.: 13/006,667

(22) Filed: Jan. 14, 2011

(65) Prior Publication Data

US 2011/0175114 A1  Jul. 21, 2011

(30) Foreign Application Priority Data

Jan. 15, 2010  (TW) .............................. 99200857 U

(51) Int. Cl.
  *H01L 33/48* (2010.01)
(52) U.S. Cl.
  USPC ........ 257/88; 257/99; 257/100; 257/E33.056; 257/E33.061
(58) Field of Classification Search
  USPC .............. 257/88, 99, 100, E33.056, E33.061
  See application file for complete search history.

(56) References Cited

U.S. PATENT DOCUMENTS

| | | | |
|---|---|---|---|
| 2006/0012991 A1* | 1/2006 | Weaver et al. | 362/235 |
| 2007/0058357 A1* | 3/2007 | Yamaguchi et al. | 362/84 |
| 2009/0140271 A1* | 6/2009 | Sah | 257/88 |

\* cited by examiner

*Primary Examiner* — Long Pham
(74) *Attorney, Agent, or Firm* — Rosenberg, Klein & Lee

(57) ABSTRACT

A film-covered LED device includes a high thermal conductive substrate, a reflector, a plurality of LED chips, and a fluorescent film. A pair of electrical contacts is respectively disposed on two ends of the high thermal conductive substrate. A thru opening is formed on the reflector, which is disposed on the high thermal conductive substrate. The LED chips are disposed on the high thermal conductive substrate and connected electrically, within the thru opening. The fluorescent film is disposed on the reflector and casted over the LED chips. Thereby, the LEDs illumination is more evenly distributed, in maintaining illumination efficiency uniformity. The yield rate is also enhanced with savings in labor cost.

6 Claims, 5 Drawing Sheets

FILM-COVERED LED DEVICE

BACKGROUND OF THE INVENTION

1. Field of the Invention

The instant disclosure relates to a film-covered LED device; more particularly, to a film-covered LED device for lighting.

2. Description of Related Art

In the current market, lighting devices such as fluorescent lamps, incandescent lamps, and recently adopted energy-saving bulbs are used commonly nowadays. However, most of these lamps have the disadvantages of rapid aging, high power consumption, high heat generation, short service life, break easily, being not recyclable, etc. Therefore, in response to above issues, the use of LED bulbs, lamps, and tubes have become available.

Please refer to FIGS. 1 and 2, wherein a conventional LED device 1a usually comprises a high thermal conductive substrate 10a, a reflector 11a, a plurality of LED chips 12a, and cured encapsulating gel 13a. A positive contact P and a negative contact N are paired at both ends of the high thermal conductive substrate 10a for power connection. A thru opening 111a is formed at the center of the reflector 11a, wherein the reflector 11a is disposed on the surface of the high thermal conductive substrate 10a. The LED chips 12a are disposed on the high thermal conductive substrate 10a and within the thru opening 111a. The cured encapsulating gel 13a includes fluorescent powders and fills the thru opening 111a, for mixing and distributing light beams.

Notably, the above LED device 1a is normally manufactured using the COB (Chip on Board) technology, which has the following disadvantages. First, when filling the thru opening 111a with the encapsulating gel 13a, a special apparatus must be used to accurately fill the hru opening 111a with the uncured encapsulating gel 13a, to maintain levelness. Next, the encapsulating gel 13a is baked for curing, which tends to have uneven thickness. Thereby, light distribution effectiveness is adversely affected.

Secondly, the encapsulating gel 13a has fluorescent powder, where the degree of concentration can be adjusted by the manufacturer as necessary, which affects the illumination efficiency of the LED chips 12a. Therefore, when replenishing the encapsulating gel 13a, the degree of concentration of fluorescent powder could not be certain is the same. The uniformity of illumination efficiency could not be maintained consequently, which affects the yield rate.

Thirdly, the steps of the COB technology are very involved. The manufacturing process requires considerable input of human resource, and the equipment cost is higher.

To address the above the issues, the inventor conducted related study and propose the following solution.

SUMMARY OF THE INVENTION

The objective of the instant disclosure is to provide a film-covered LED device. The characteristics include uniformity in light distribution and efficiency, with simplified manufacturing steps in saving labor and equipment cost.

To resolve aforementioned technical issues, the instant disclosure provides a film-covered LED device, which comprises: a high thermal conductive substrate having a pair of electrical contacts at both ends thereof; a reflector disposed on the high thermal conductive substrate, wherein an thru opening is formed on the reflector; a plurality of LED chips disposed on the high thermal conductive substrate and within the thru opening; and a fluorescent film adhering on the reflector and casts over the LED chips.

The instant disclosure has the following advantages. First, by disposing the fluorescent film on the reflector and casting over the LED chips, proper light mixing and distribution are achieved. Secondly, in comparing to direct packaging of chips done conventionally, the manufacturing steps using the fluorescent film is less complex. The LED device can be mass-produced with assurance in quality, such as uniformity in illumination efficiency, elimination of unevenness in thickness for the encapsulating layer, uniformity in illumination effectiveness, and higher yield rate. Thirdly, the equipment cost for adopting the fluorescent film is very economical, and no significant manpower is needed, which save cost.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
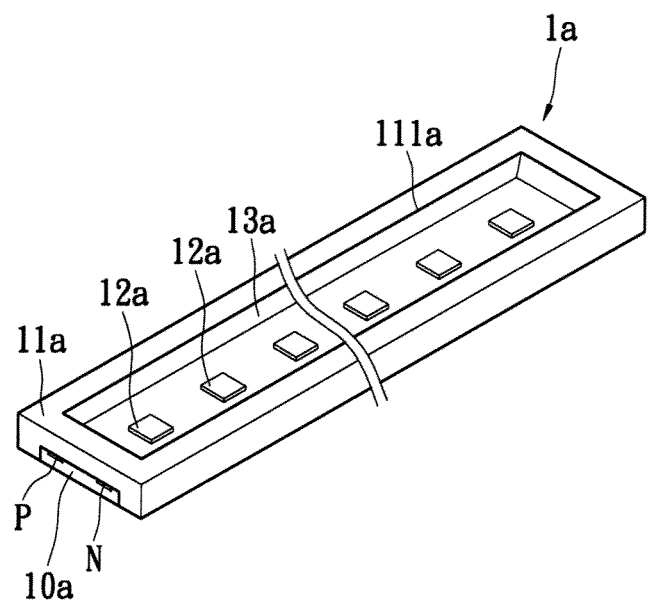
FIG. 1 shows a perspective view of an LED device of the prior art.
Figure 2:
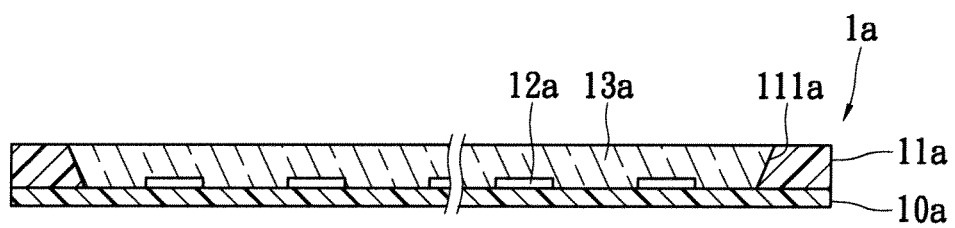
FIG. 2 shows a cross-sectional view of the LED device of the prior art.
Figure 3:
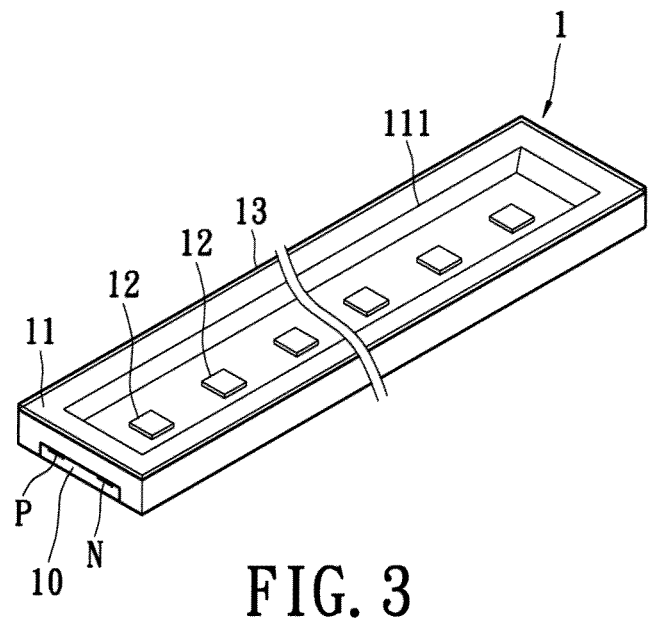
FIG. 3 shows a perspective view of a film-covered LED device of the instant disclosure.
Figure 4:
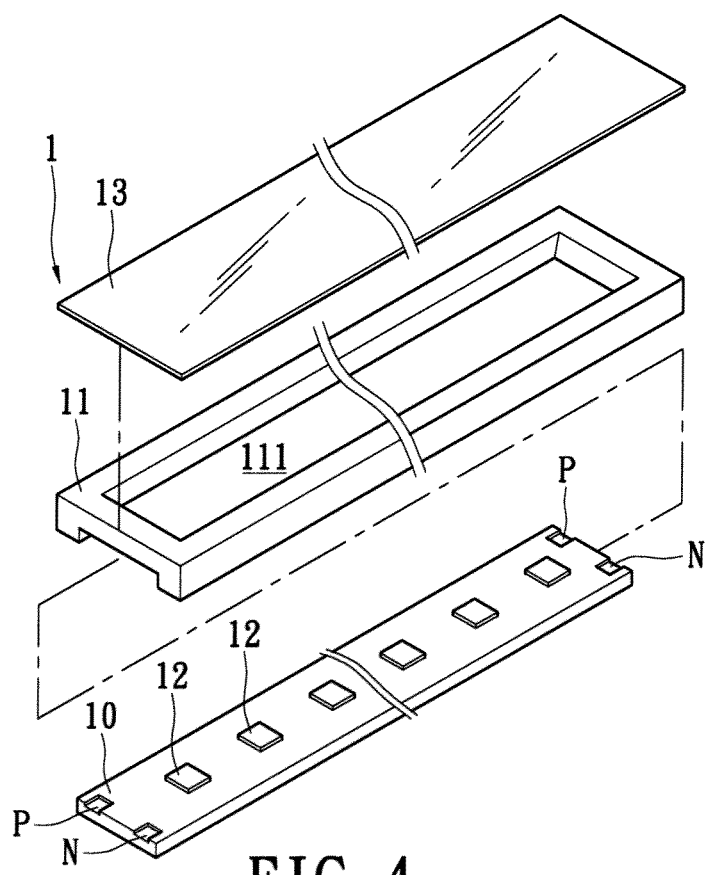
FIG. 4 shows an exploded view of the film-covered LED device of the instant disclosure.
Figure 5:
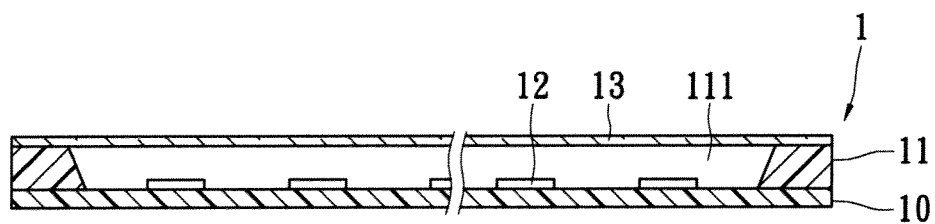
FIG. 5 shows a cross-sectional view of the film-covered LED device of the instant disclosure.

Please refer to FIGS. 3 and 5. The instant disclosure provides a film-covered LED device 1 for lighting, which comprises a high thermal conductive substrate 10, a reflector 11, a plurality of LED chips 12, and a fluorescent film 13.

In the instant embodiment, the high thermal conductive substrate 10 is a rectangular shaped metallic or ceramic substrate. The metallic substrate can be of aluminum or copper, while the ceramic substrate can be made of aluminum oxide ($Al_2O_3$), aluminum nitride (AlN), silicon carbide (SiC), silicon nitride ($Si_3N_4$), or beryllium oxide (BeO). Internal circuitry (not shown) is included within the high thermal conductive substrate 10. For the two ends of the high thermal conductive substrate 10, a pair of electrical contacts is disposed on each end, namely a positive contact P and a negative contact N, for power connection.

The reflector 11 can be a metallic, plastic, or rubber frame. The purpose is to collect the light emitted by the LED chips 12 for focusing. A rectangular thru opening 111 is formed at the center of the reflector 11. The reflector 11 is disposed on the high thermal conductive substrate 10.

For in the instant embodiment, the LED chips 12 are soldered onto the high thermal conductive substrate 10 and within the thru opening 111 of the reflector 11. Hence, the LED chips 12 are electrically connected to the high thermal conductive substrate 10.

Being transparent and adhesive, the fluorescent film 13 is manufactured using fluorescent powder and filming machine (not shown). Based on application, the degree of concentration and particle size of the fluorescent powder can be adjusted for the manufacturing process, to change the illumination property. Once manufactured, the fluorescent film 13 can be cut according to the size of the reflector 11. For the instant embodiment, the fluorescent film 13 is disposed on the reflector 11 and cast over the LED chips 12. Accordingly, light mixing and distribution are achieved, where illuminations of the LED chips are evenly distributed.

Figure 6:
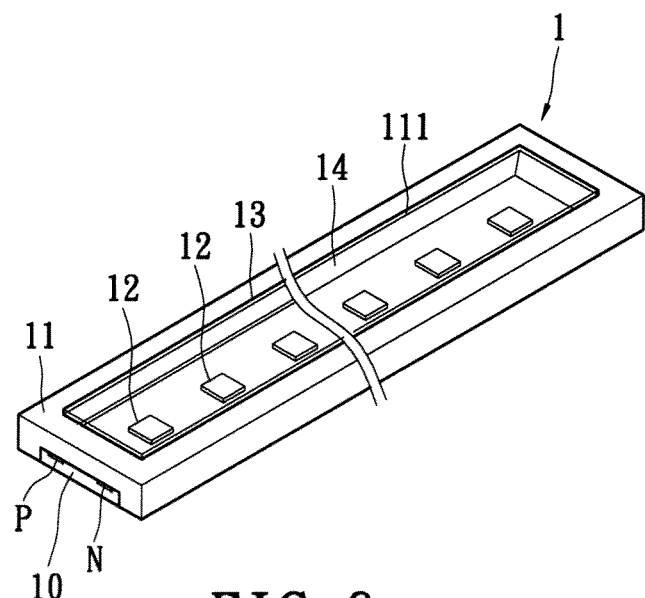
FIG. 6 shows a perspective view of a film-covered LED device of a second embodiment of the instant disclosure.
Figure 7:
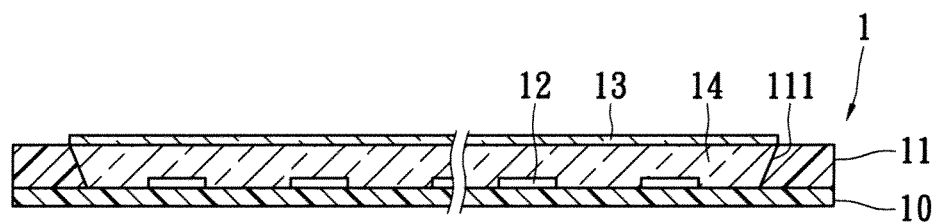
FIG. 7 shows a cross-sectional view of the film-covered LED device of the second embodiment of the instant disclosure.

Please refer to FIGS. 6 and 7, which show a second embodiment of the instant disclosure. Different from the first embodiment, the thru opening 111 is filled with a clear gel 14 for the second embodiment. The fluorescent film 13 is disposed on the cured clear gel 14 and cast over the LED chips 12. Same results are achieved in light mixing and distribution, with added benefit of using less fluorescent film 13.

Figure 8:
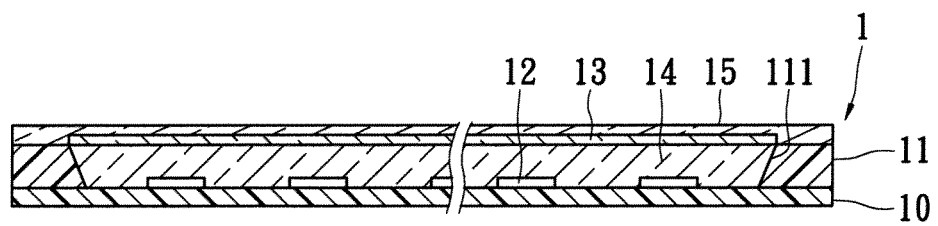
FIG. 8 shows a cross-sectional view of a film-covered LED device of a third embodiment of the instant disclosure.

Please refer to FIG. 8, which shows a third embodiment of the instant disclosure. Different from the second embodiment, a clear gel layer 15 is further disposed over the fluorescent film 13 for the third embodiment of the instant disclosure. The addition is to prevent the fluorescent film 13 from coming off.

Figure 9:
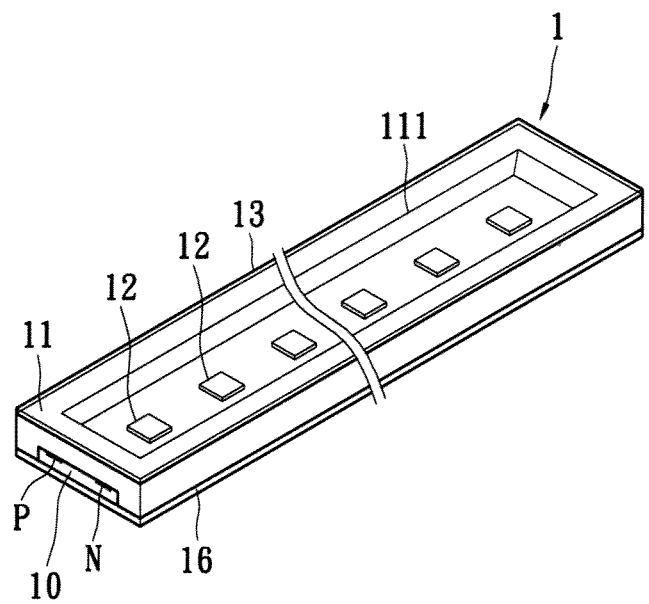
FIG. 9 shows a perspective view of a film-covered LED device of a fourth embodiment of the instant disclosure.

Please refer to FIG. 9, which shows a fourth embodiment of the instant disclosure. Different from the third embodiment, a heat-dissipating element 16 is further disposed under the high thermal conductive substrate 10 for the instant embodiment. The heat-dissipating element 16 can be a metallic heat-dissipating strip for heat dissipation.

Figure 10:
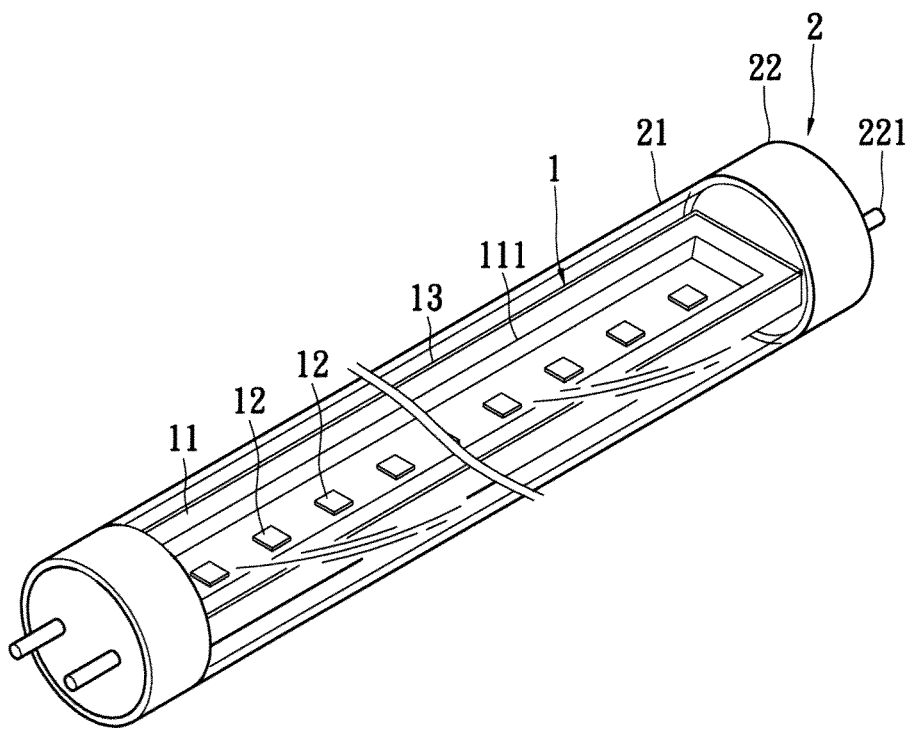
FIG. 10 shows a film-covered LED device of the instant disclosure in use.

Please refer to FIG. 10, in use, the film-covered LED device 1 can be used with back-light module, fluorescent lamp, downlight, billboard lighting system, etc. For the instant embodiment, the film-covered LED device 1 is disposed inside a lamp tube 21 of a fluorescent lamp 2. Two lamp caps 22 are installed on two ends of the lamp tube 21 respectively. Two metallic pins 221 are disposed on each lamp cap 22 for power connection.

For the instant disclosure, the fluorescent film 13 is directly disposed on the reflector 11 and casted over the LED chips 12. Thereby, light mixing and uniform light distribution for the LED chips 12 are achieved. In comparing to conventional chip-on-board (COB) method, the manufacturing process of the fluorescent film 13 is less complex, and the fluorescent film 13 can be mass-produced uniformly to maintain uniform illumination efficiency. Since gel-filling nor baking is needed, the issue of uneven thickness is eliminated. The use of fluorescent film 13 gives uniform illumination and enhances the yield rate. Furthermore, the manufacturing equipments of the fluorescent film 13 are very economical, and no significant manpower is needed, which saves cost.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A film-covered LED device, comprising:
    a high thermal conductive substrate having a pair of electrical contacts on two ends thereof respectively;
    a reflector disposed on the high thermal conductive substrate, a thru opening being formed on the reflector;
    a plurality of LED chips disposed on the high thermal conductive substrate within the thru opening and connected electrically;
    a fluorescent film disposed on the reflector and casted over the LED chips; and
    a cured clear gel layer disposed on the fluorescent film.

2. The film-covered LED device of claim 1, wherein the thru opening is rectangular-shaped and at the middle of the reflector, a cured clear gel being disposed within the thru opening, the fluorescent film being disposed on the cured clear gel.

3. The film-covered LED device of claim 1, wherein the reflector is disposed on the high thermal conductive substrate, a heat-dissipating element being disposed at the bottom of the high thermal conductive substrate.

4. The film-covered LED device of claim 1, wherein the reflector is a metallic, plastic, or a rubber frame.

5. The film-covered LED device of claim 1, wherein the film-covered LED device is disposed within the back-light module, the fluorescent lamp, the downlight, or the billboard lighting system.

6. The film-covered LED device of claim 1, wherein the high thermal conductive substrate is a metallic or ceramic substrate.

* * * * *